(12) United States Patent
Cappellani et al.

(10) Patent No.: US 9,029,221 B2
(45) Date of Patent: May 12, 2015

(54) SEMICONDUCTOR DEVICES HAVING THREE-DIMENSIONAL BODIES WITH MODULATED HEIGHTS

(75) Inventors: Annalisa Cappellani, Portland, OR (US); Kelin J. Kuhn, Aloha, OR (US); Rafael Rios, Portland, OR (US); Aura Cecilia Davila Latorre, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 13/995,467

(22) PCT Filed: Dec. 21, 2011

(86) PCT No.: PCT/US2011/066544
§ 371 (c)(1),
(2), (4) Date: Jun. 18, 2013

(87) PCT Pub. No.: WO2013/095443
PCT Pub. Date: Jun. 27, 2013

(65) Prior Publication Data
US 2013/0320448 A1   Dec. 5, 2013

(51) Int. Cl.
*H01L 21/336*   (2006.01)
*H01L 29/66*   (2006.01)
*H01L 29/78*   (2006.01)
*H01L 21/8234*   (2006.01)
*H01L 21/84*   (2006.01)
*H01L 27/088*   (2006.01)
(Continued)

(52) U.S. Cl.
CPC ...... *H01L 29/7831* (2013.01); *H01L 29/66484* (2013.01); *H01L 21/823431* (2013.01); *H01L 21/845* (2013.01); *H01L 27/0886* (2013.01); *H01L 27/1211* (2013.01); *H01L 21/3083* (2013.01)

(58) Field of Classification Search
CPC .................. H01L 29/66795; H01L 29/785
USPC .......................... 257/365; 438/283
See application file for complete search history.

(56) References Cited

U.S. PATENT DOCUMENTS 8,101,994 B2 * 1/2012 Yu et al. ................. 257/330
2005/0199919 A1   9/2005 Liu
(Continued)

OTHER PUBLICATIONS

International Search Report and Written Opinion for PCT Patent Application No. PCT/US2011/066544 Mailed Aug. 30, 2012, 9 Pages.

(Continued)

*Primary Examiner* — Fernando L Toledo
*Assistant Examiner* — Neil Prasad
(74) *Attorney, Agent, or Firm* — Blakely, Sokoloff, Taylor & Zafman LLP

(57) ABSTRACT

Semiconductor devices having three-dimensional bodies with modulated heights and methods to form such devices are described. For example, a semiconductor structure includes a first semiconductor device having a first semiconductor body disposed above a substrate. The first semiconductor body has a first height and an uppermost surface with a first horizontal plane. The semiconductor structure also includes a second semiconductor device having a second semiconductor body disposed above the substrate. The second semiconductor body has a second height and an uppermost surface with a second horizontal plane. The first and second horizontal planes are co-planar and the first and second heights are different.

26 Claims, 6 Drawing Sheets

(51) Int. Cl.
*H01L 27/12* (2006.01)
*H01L 21/308* (2006.01)

(56) References Cited

U.S. PATENT DOCUMENTS

2005/0215014 A1 9/2005 Ahn et al.
2008/0128797 A1 6/2008 Dyer et al.

OTHER PUBLICATIONS

International Preliminary Report on Patentability from PCT/US2011/066544 mailed Jul. 3, 2014, 6 pgs.

Search Report from Taiwan Patent Application No. 101143246 mailed Jul. 31, 2014, 1 pgs.

* cited by examiner

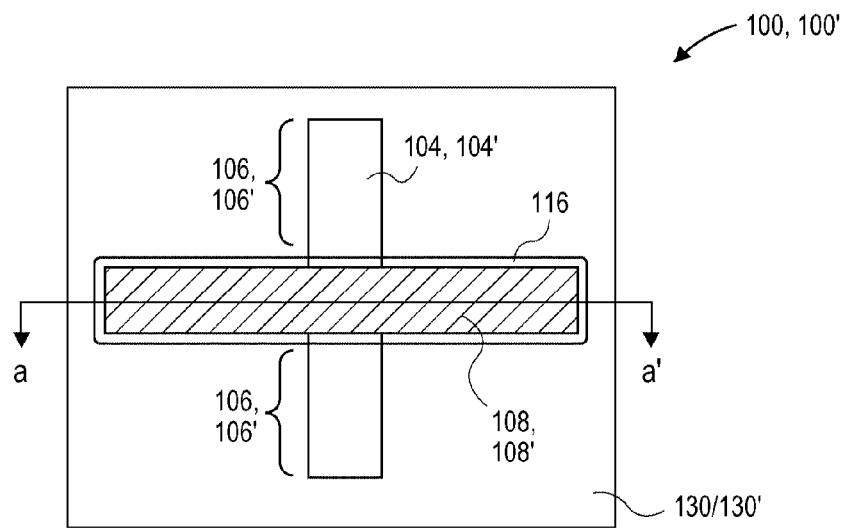
FIG. 1A
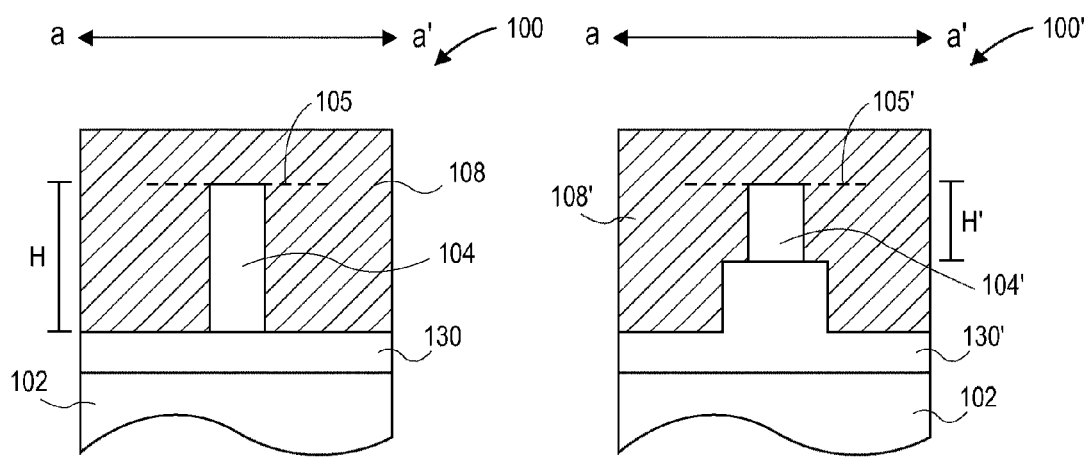
FIG. 1B  FIG. 1B'

SEMICONDUCTOR DEVICES HAVING THREE-DIMENSIONAL BODIES WITH MODULATED HEIGHTS

CLAIM OF PRIORITY

This application is a U.S. National Phase application under 35 U.S.C. §371 of International Application No. PCT/US2011/066544, filed Dec. 21, 2011, entitled "SEMICONDUCTOR DEVICES HAVING THREE-DIMENSIONAL BODIES WITH MODULATED HEIGHTS," the entire contents of which are incorporated herein by reference.

TECHNICAL FIELD

Embodiments of the invention are in the field of semiconductor devices and, in particular, semiconductor devices having three-dimensional bodies with modulated heights and methods to form such devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate cap parasitics.

Many different techniques have been attempted to fabricate and size three-dimensional devices. However, significant improvements are still needed in the area of Z-modulation for such semiconductor devices.

SUMMARY

Embodiments of the present invention include semiconductor devices having three-dimensional bodies with modulated heights and methods to form such devices.

In an embodiment, a semiconductor structure includes a first semiconductor device having a first semiconductor body disposed above a substrate. The first semiconductor body has a first height and an uppermost surface with a first horizontal plane. The semiconductor structure also includes a second semiconductor device having a second semiconductor body disposed above the substrate. The second semiconductor body has a second height and an uppermost surface with a second horizontal plane. The first and second horizontal planes are co-planar and the first and second heights are different.

In another embodiment, a semiconductor structure includes a first semiconductor device having a first semiconductor body disposed above a substrate. The first semiconductor body has a first height and an uppermost surface with a first horizontal plane. The semiconductor structure also includes a second semiconductor device having a second semiconductor body disposed above the substrate. The second semiconductor body has a second height and an uppermost surface with a second horizontal plane. The second height is less than the first height. The semiconductor structure also includes a third semiconductor device having a third semiconductor body disposed above the substrate. The third semiconductor body has a third height and an uppermost surface with a third horizontal plane. The third height is less than the second height. The first, second and third horizontal planes are co-planar.

In another embodiment, a method of fabricating a semiconductor structure includes forming a first fin from a first region of a substrate, the first fin having a first height. A second fin is formed from a second region of the substrate, the second fin having a second height different from the first height. A dielectric layer is formed below the first and second fins. First and second semiconductor devices are formed from the first and second fins, respectively.

BRIEF DESCRIPTION OF THE DRAWINGS

FIG. 1A illustrates a plan view of a semiconductor device, in accordance with an embodiment of the present invention.

FIG. 1B illustrates a cross-sectional view of a semiconductor device of FIG. 1A, as taken along the a-a' axis, in accordance with an embodiment of the present invention.

FIG. 1B' illustrates a cross-sectional view of another semiconductor device of FIG. 1A, as taken along the a-a' axis, in accordance with another embodiment of the present invention.

DETAILED DESCRIPTION

Figure 2A:
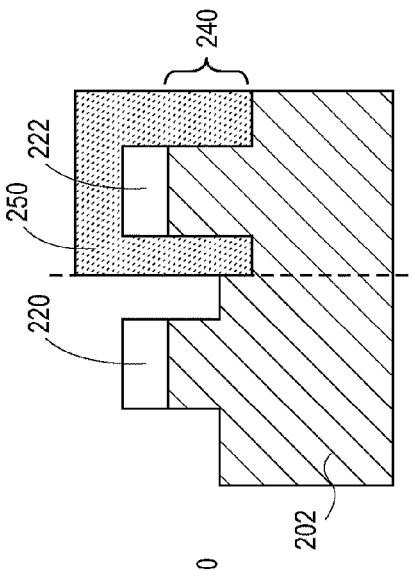
FIGS. 2A-2F illustrate cross-sectional views representing various operations in a method of fabricating a semiconductor structure, in accordance with an embodiment of the present invention.

Semiconductor devices having three-dimensional bodies with modulated heights and methods to form such devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are effectively directed at silicon height ($H_{Si}$) modulation for multiple devices fabricated within a common substrate. Such embodiments may enable the fabrication of devices with varying Z (e.g., varying active region area). In one such embodiment, the height of the active region to be included in a specific three-dimensional device is determined during a fin patterning operation, where a certain height is patterned for a given Z (also referred to as Zwa, or Z of the width of the active region). Devices may be fabricated with different numbers of semiconductor body heights within certain devices, all on a common substrate.

Embodiments of the present invention may be described as selective height removal, or as a predetermined fabrication height during active region patterning. Viewed either way, a first device with a first Z value having a first active region height therein can be fabricated on the same substrate as a second device with a second Z value having a second active region height. With respect to making an analogy with other three-dimensional devices, the varying heights may be viewed as Z modulation or as $H_{Si}$ (silicon height) modulation. In an embodiment, a spacer technique is used to select the height to be fabricated and included as an active diffusion in a given fin structure.

In circuit design, it may be critical to enable the ability to balance the drive strength of various transistors relative to each other in order to optimize an N/P ratio. Such optimization may achieve robust circuit functionality and/or improve circuit performance and power trade-offs. In SRAM memory cell design, Vccmin is strongly affected or impacted by having the correct cell balance. Transistor drive strength is typically varied by selecting the transistor width (Zwa in case of 3D FinFET, tri-gate, or nanowire device). In planar devices, transistor drive strength may be readily modulated for a by drawing a shorter or longer physical width (Z) during layout. By contrast, for tri-gate or FinFET devices, the transistor Z is usually varied by choosing the number of fins per device. However, as fins get taller, the available Z for such quantized fin counts is manifested in larger quantum increments, leading to the possibility of unoptimized circuit operation.

Accordingly, one or more embodiments described herein involve the building of a spacer around fin sidewalls formed to protect an active regions and to expose a selected region to be converted to a dielectric material, such as an oxide. The height of the active area protected by the spacer ultimately corresponds to the height of the active region fabricated for a given device. In an embodiment, the heights of the active regions for a pair of devices fabricated on the same substrate differs, enabling modulation of the active area, hence Z, of the two devices. Thus, the $H_{Si}$ of one fin is independently modulated from another on the same wafer. In an embodiment, such modulation permits fabrication of a single SRAM template to support a variety of different process variants (e.g., SP, LP, GP) without changes to an existing plate set.

In an embodiment, methods are provided to achieve height modulation involve a cut in the diffusion fin area from the bottom up, which enables a reduction in parasitic capacitance as compared with a method which otherwise cuts the diffusion fin from the top in a replacement gate process flow. In one embodiment, the isolation of subfins with bulk silicon starting material is performed by using an under fin oxidation (UFO) process. Spacer formation with modulated height allows use of this approach to provide varied active regions or body height, as opposed to resulting in a constant fin height across the product die. In a specific such embodiment, modulation of the heights is performed at the fin etch areas, with removal occurring under the source and drain regions as well as and under the channel. More details regarding specific methods are described in association with FIGS. 2A-2F, 3, 4 and 5A-5H below.

Thus, in an aspect, devices with height modulation on a common substrate are provided by approaches described herein. In an example, FIG. 1A illustrates a plan view of semiconductor devices 100 and 100', in accordance with an embodiment of the present invention. FIG. 1B illustrates a cross-sectional view of the semiconductor device 100 of FIG. 1A, as taken along the a-a' axis. FIG. 1B' illustrates a cross-sectional view of the semiconductor device 100' of FIG. 1A, as taken along the a-a' axis.

Referring to FIG. 1A, a semiconductor device 100 or 100' includes a semiconductor body 104 or 104, disposed above a substrate (shown in FIGS. 1B and 1B' as 102). The semiconductor body 104 or 104' includes a channel region underneath a gate stack 108 or 108'. The semiconductor body 104 or 104' also includes and a pair of source and drain regions 106 or 106' on either side of the channel region.

Referring to FIG. 1B, the semiconductor device 100 has a height (H) and an uppermost surface with a horizontal plane 105. Referring to FIG. 1B', the semiconductor device 100' has a height (H') and an uppermost surface with a horizontal plane 105'. Referring to both FIGS. 1B and 1B', the semiconductor devices 100 and 100' are formed above the common substrate 102. The horizontal planes 105 and 105' are co-planar. However, the heights H and H' are different. Thus, in an embodiment, a common substrate 102 has disposed thereon devices with differing semiconductor body heights. It is to be understood that embodiments herein may contemplate any height differential between devices, so long as the heights differ, and hence have a different Z.

Referring to FIGS. 1A, 1B, and 1B', the semiconductor device 100 or 100' further includes an intervening dielectric layer 130 and 130' disposed between the substrate 102 and each of the semiconductor bodies 104 or 104'. In an embodiment, the intervening dielectric layer is common to both devices and, therefore, 130 and 130' are continuous across a common substrate 102. The intervening dielectric layer 130 or 130' may be an artifact of the fabrication process used to provide modulated height structures. It is to be understood that although possibly present during partial fabrication, any intervening dielectric layer 130 or 130' may be removed prior to completion of a semiconductor device.

In an embodiment, the intervening dielectric layer 130 or 130' isolated a portion of or the entire region of semiconductor body 104 or 104' from substrate 102. In one such embodiment, each of the semiconductor bodies 104 or 104' has an isolated channel region. In one such embodiment, each of the semiconductor bodies 104 or 104' has a pair of isolated source and drain regions 106 or 106'. Formation of such an intervening dielectric layer 130 or 130' is described in greater detail below.

Substrate 102 and, if originally formed from the substrate 102, semiconductor bodies 104 and 104' may be composed of a semiconductor material that can withstand a manufacturing process and in which charge can migrate. In an embodiment, substrate 102 is composed of a crystalline silicon, silicon/germanium or germanium layer doped with a charge carrier, such as but not limited to phosphorus, arsenic, boron or a combination thereof. In one embodiment, the concentration of silicon atoms in substrate 102 is greater than 97%. In another embodiment, substrate 102 is composed of an epitaxial layer grown atop a distinct crystalline substrate, e.g. a silicon epitaxial layer grown atop a boron-doped bulk silicon mono-crystalline substrate. Substrate 102 may also include an insulating layer disposed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. Substrate 102 may alternatively be composed of a group III-V material. In an embodiment, substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, substrate 102 is composed of crystalline silicon and the charge-carrier dopant impurity atoms are one such as, but not limited to, boron, arsenic, indium or phosphorus. In another embodiment, substrate 102 is composed of a III-V material and the charge-carrier dopant impurity atoms are ones such as, but not limited to, carbon, silicon, germanium, oxygen, sulfur, selenium or tellurium. In another embodiment, the semiconductor substrate and, hence, the semiconductor body 104 or 104' is undoped or only lightly doped.

In an embodiment, the semiconductor device 100 or 100' is a non-planar device such as, but not limited to, a fin-FET or a tri-gate device. In such an embodiment, the semiconducting channel region is composed of or is formed in a three-dimensional body. In one such embodiment, the gate electrode stack 108 or 108' surrounds at least a top surface and a pair of sidewalls of the three-dimensional body, as depicted in FIGS. 1B and 1B'. In another embodiment, at least the channel region is made to be a discrete three-dimensional body, such as in a gate-all-around device. In one such embodiment, the gate electrode stack 108 or 108' completely surrounds the channel region.

In the case of a three-dimensional body 104 or 104', whether isolated or not, the three-dimensional body 104 or 104' may be fabricated from a bulk substrate. Alternatively, the three-dimensional body 104 or 104' may be fabricated from a starting semiconductor-on-insulator substrate. In another embodiment, the three-dimensional body 104 or 104' is formed directly from a bulk substrate and local oxidation is used to form electrically insulative underlying regions. In another alternative embodiment, the device 100 or 100' is formed directly from a bulk substrate and doping is used to form electrically isolated active regions. In one such embodiment, the an omega-FET type structure is formed.

As mentioned above, referring to FIGS. 1A, 1B and 1B', in an embodiment, the semiconductor devices 100 or 100' further include respective gate electrode stacks 108 or 108' at least partially surrounding a portion of the semiconductor body 104 or 104' of the device. In one such embodiment, the gate electrode stacks 108 or 108' each include a gate dielectric layer and a gate electrode layer (not shown). In an embodiment, the gate electrode of gate electrode stack 108 or 108' is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the semiconductor body 104 or 104'. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, although not shown, the semiconductor devices 100 or 100' further include a pair of contacts at least partially surrounding respective portions of the semiconductor body 104 or 104', e.g., at least partially surrounding source and drain regions 106 or 106'. The contacts are, in an embodiment, fabricated from a metal species. The metal species may be a pure metal, such as nickel or cobalt, or may be an alloy such as a metal-metal alloy or a metal-semiconductor alloy (e.g., such as a silicide material). In an embodiment, the semiconductor devices 100 or 100' further include spacers 116 (as depicted in FIG. 1A). The spacers 116 may be disposed between the gate electrode stack 108 or 108' and a pair of contacts at least partially surrounding source and drain regions 106 or 106'. In an embodiment, the spacers 116 are composed of an insulative dielectric material such as, but not limited to, silicon dioxide, silicon oxy-nitride or silicon nitride.

Semiconductor device 100 or 100' may be any semiconductor device incorporating a gate, a channel region and a pair of source/drain regions. In an embodiment, semiconductor device 100 or 100' is one such as, but not limited to, a MOSFET, a memory transistor, or a Microelectromechanical System (MEMS). In one embodiment, semiconductor device 100 or 100' is a three-dimensional MOS-FET and is an isolated device or is one device in a plurality of nested devices. As will be appreciated for a typical integrated circuit, both N- and P-channel transistors may be fabricated on a single substrate to form a CMOS integrated circuit, a semiconductor structure for which is described in greater detail below.

Although the device 100 or 100' described above is for a single device, e.g., an NMOS or a PMOS device, a CMOS architecture may also be formed to include both NMOS and PMOS channel devices disposed on or above the same substrate. A plurality of such NMOS devices, however, may be fabricated to have different semiconductor body heights. Likewise, a plurality of such PMOS devices may be fabricated to have different semiconductor body heights. In an embodiment, semiconductor devices 100 and 100' are formed on a common substrate, have semiconductor bodies composed of silicon, and are both NMOS devices. In another embodiment, semiconductor devices 100 and 100' are formed on a common substrate, have semiconductor bodies composed of silicon germanium, and are both PMOS devices.

Semiconductor body height modulation may, in an embodiment, be achieved by initiating fabrication on a bulk silicon substrate and patterning a fin using a spacer patterning technique by selective masking an area to be etched. The etching of the fin is performed to the depth needed for subfin isolation (e.g., an operation that sets the height as active) for a particular structure. In one such embodiment, two different depths are achieved, as described in association with FIGS. 2A-2F. In another embodiment, three different depths are achieved, as described in association with FIGS. 5A-5H.

Thus, in another aspect, methods of fabricating a semiconductor structure are provided. For example, FIGS. 2A-2F, 3 and 4 illustrate cross-sectional views representing various operations in a method of fabricating a semiconductor structure, in accordance with an embodiment of the present invention.

Referring to FIG. 2A, prior to fin etch, a first hardmask layer 220 and a second hardmask layer 222 are formed above a substrate 202. In an embodiment, the substrate is a crystalline substrate, such as a bulk single crystalline silicon substrate. A masking layer 230 is formed to cover a region including hardmask layer 220. In FIGS. 2A-2F, for convenience, a dashed line is used to distinguish two different regions of a common substrate 202. The regions may be in contact with one another, e.g., as if the dashed line were not present, or may be separated from one another.

Figure 2B:
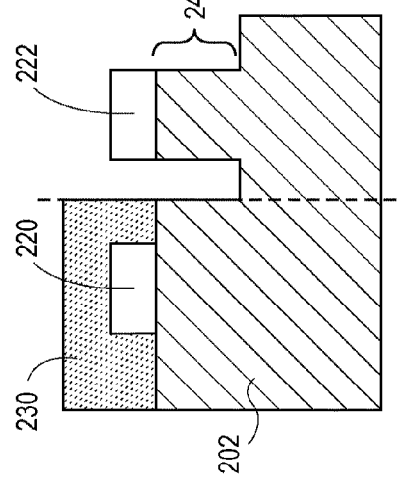
Figure 2C:
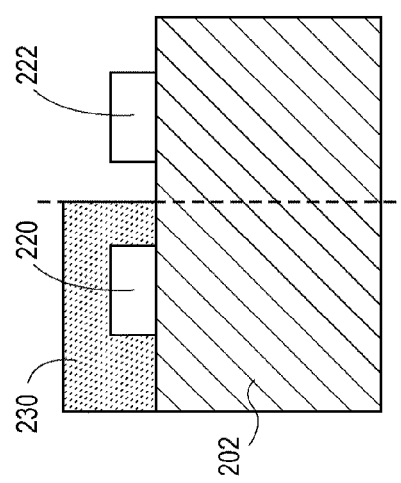

The portion of the substrate 202 not protected by masking layer 230 is then patterned to have the pattern of hardmask 222 and to form fin 240, as depicted in FIG. 2B. Referring to FIG. 2C, fin 240 and (if still present) hardmask 222 are covered with a masking layer 250. Additionally, masking layer 230 is removed and the portions of substrate 202 not protected by masking layer 250 is then patterned to have the pattern of hardmask 220 and to form fin 242.

Figure 2D:
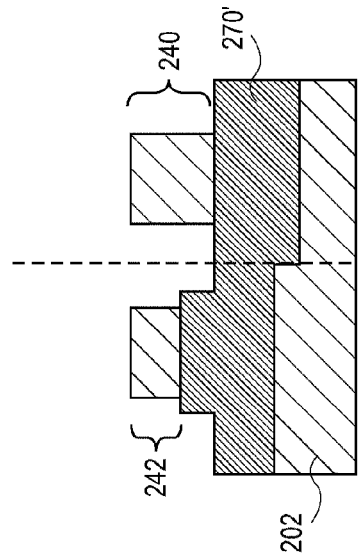
Figure 2E:
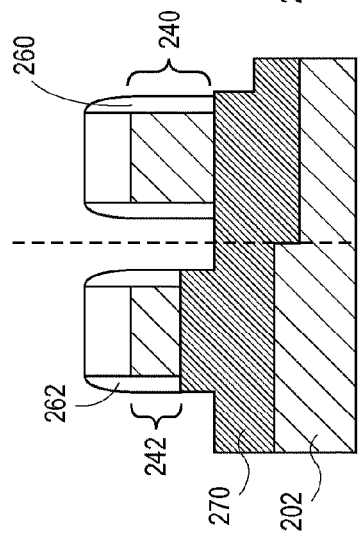
Figure 2F:
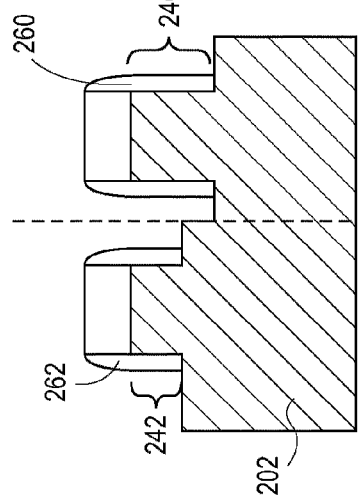
Figure 3:
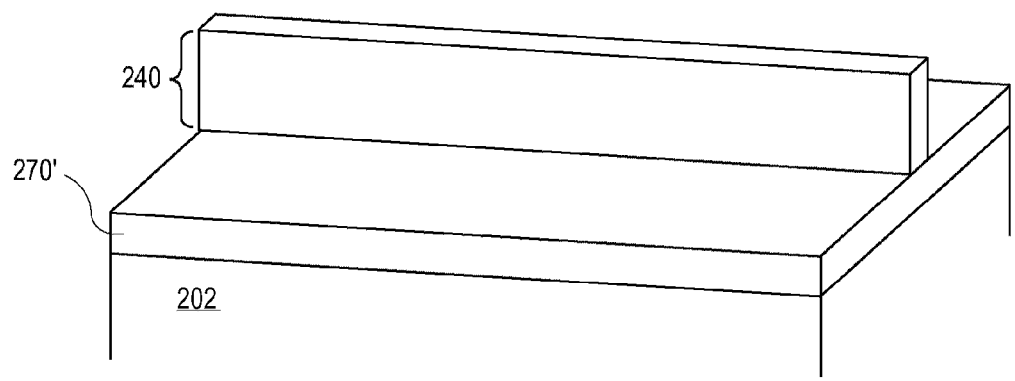
FIG. 3 illustrates a cross-sectional view representing an operation in a method of fabricating a semiconductor structure, in accordance with an embodiment of the present invention.
Figure 4:
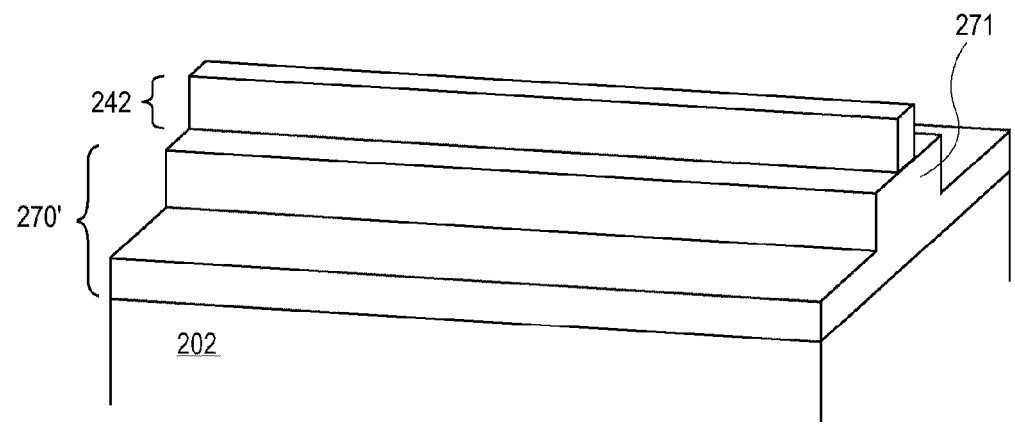
FIG. 4 illustrates a cross-sectional view representing an operation in a method of fabricating a semiconductor structure, in accordance with an embodiment of the present invention.

Referring to FIG. 2D, masking layer 250 is removed and a first set of dielectric spacers 260 is formed along the sidewalls of fin 240, while a second set of dielectric spacers 262 is formed along the sidewalls of fin 242. It is to be understood that, in the case where the structures are directly adjacent, a sidewall spacer may form along the sidewalls of the exposed portions of layers 204 and 206. The exposed portions of substrate 202 are then oxidized to form an intervening dielectric layer 270, as depicted in FIG. 2E. Then, referring to FIG. 2F, any remaining hardmask layers and sidewall spacers are removed to provide fin 240 and fin 242 above intervening dielectric layer 270. Furthermore, the intervening dielectric layer may be planarized by the addition of material or by an etch process to provide a modified intervening dielectric layer 270'. FIG. 3 depicts another view of fin 240, while FIG. 4 depicts another view of fin 242. It is noted that the portion of intervening dielectric layer 270 or 270' under fin 242 is thicker than the portion of intervening dielectric layer 270 under fin 240. Also, the heights of the fins 240 and 242 are different.

Referring again to FIG. 2E, in an embodiment, the exposed portions of substrate 202 are oxidized to form the intervening dielectric layer 270 by "under fin oxidation" (UFO). In an embodiment, the use of spacers may be required if a same or like material is being oxidized, and may even be included if non-like materials are used. In an embodiment, an oxidizing atmosphere or an adjacent oxidizing material may be used for UFO. However, in another embodiment, oxygen implant is used. In some embodiments, a portion of a material is recessed prior to UFO which may reduce the extent of so-called birds-beak formation during oxidation. Thus, the oxidation may be performed directly, by recessing first, or by oxygen implant, or a combination thereof. In another embodiment, in place of UFO, selective removal of a material at the bottom of the fin (e.g., a material that has been previously deposited on the silicon wafer before an additional fin material deposition, such as silicon germanium on a silicon substrate) is performed and replaced with a dielectric material, such as silicon dioxide or silicon nitride. In either the UFO case or the selective material removal case, the location where reoxidation or material replacement is performed can vary. For example, in one such embodiment, the reoxidation or material removal is carried out post gate etch, post spacer etch, at an undercut location, at a replacement gate operation, or at a through contact operation, or a combination thereof.

Referring again to FIGS. 3 and 4, the method thus includes forming a first fin 240 from a first region of the substrate 202. The first fin includes a patterned portion of a first height of the substrate 202. A second fin 242 is formed from a second region of the substrate 202. The second fin 242 includes a patterned portion of substrate 202 that has a height less than the height of fin 240. First and second semiconductor devices may then be formed from the first and second fins 240 and 242, respectively.

In an embodiment, the method further includes forming a third fin from a third region of the substrate 202. For example, FIGS. 5A-5H illustrate cross-sectional views representing various operations in a method of fabricating a semiconductor structure, in accordance with an embodiment of the present invention.

Figure 5A:
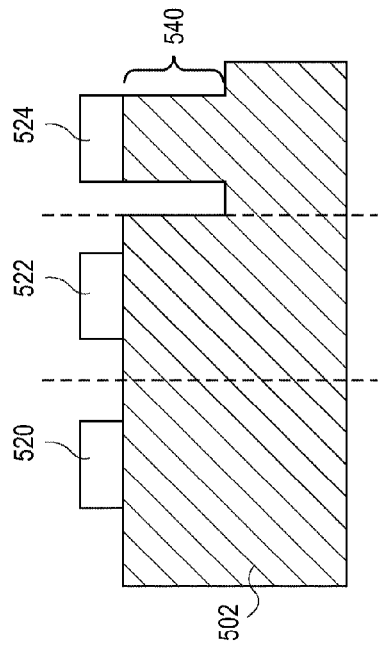
FIGS. 5A-5H illustrate cross-sectional views representing various operations in a method of fabricating a semiconductor structure, in accordance with an embodiment of the present invention.
Figure 5B:
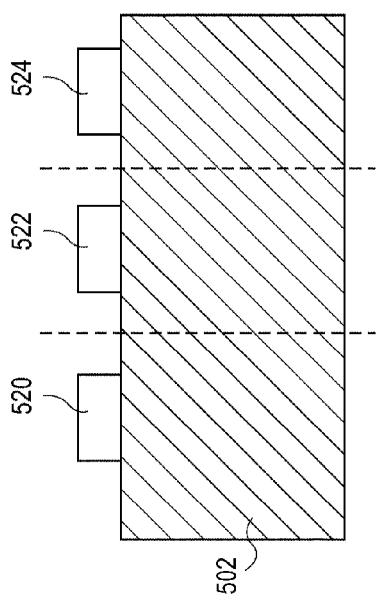

Referring to FIG. 5A, prior to fin etch, a first hardmask layer 520, a second hardmask layer 522, and a third hardmask layer 524 are formed above a substrate 502. A masking layer 530 is then formed to cover a region including hardmask layers 520 and 522, as depicted in FIG. 5B. In FIGS. 5A-5H, for convenience, dashed lines are used to distinguish three different regions of a common substrate 502. The regions may be in contact with one another, e.g., as if the dashed lines were not present, or may be separated from one another.

Figure 5C:
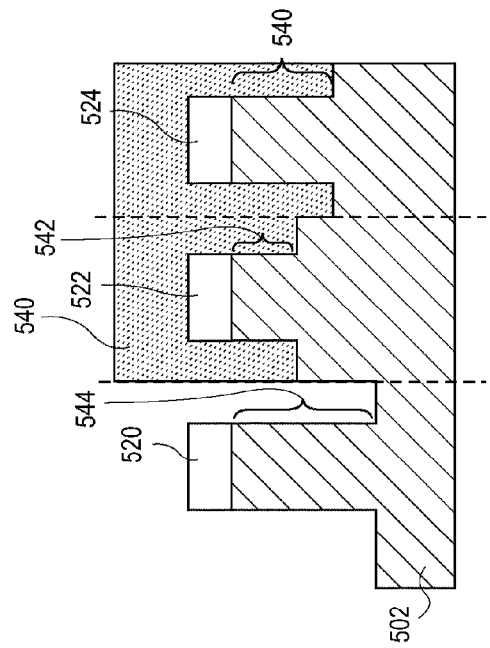

The portions of the a substrate 502 not protected by masking layer 530 are then patterned to have the pattern of hardmask 524 and to form fin 540, as depicted in FIG. 5B. Referring to FIG. 5C, fin 540 and (if still present) hardmask 524 are covered with a masking layer 550. Additionally, masking layer 530 is removed from the central region and the portions of substrate 502 not protected by masking layer 550 or remaining portions of 530 are then patterned to have the pattern of hardmask 522 and to form fin 542.

Figure 5D:
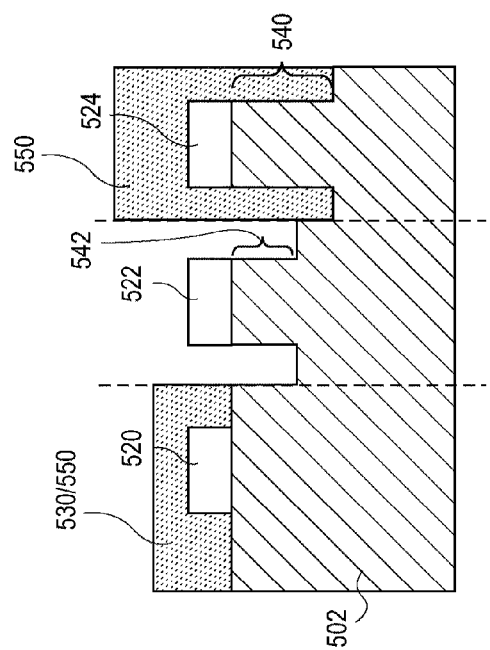

Referring to FIG. 5D, fin 542 and (if still present) hardmask 522 are covered with a masking layer 590. Additionally, masking layer 530/550 is removed from the left region and the portions of substrate 502 not protected by masking layer 590 or remaining portions of 550 are then patterned to have the pattern of hardmask 520 and to form fin 544.

Figure 5E:
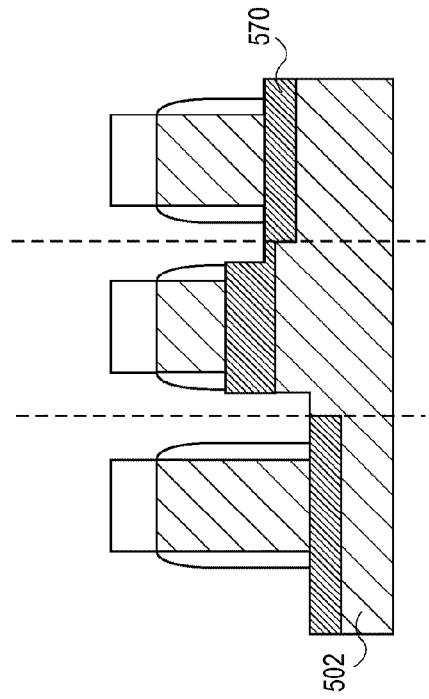
Figure 5F:
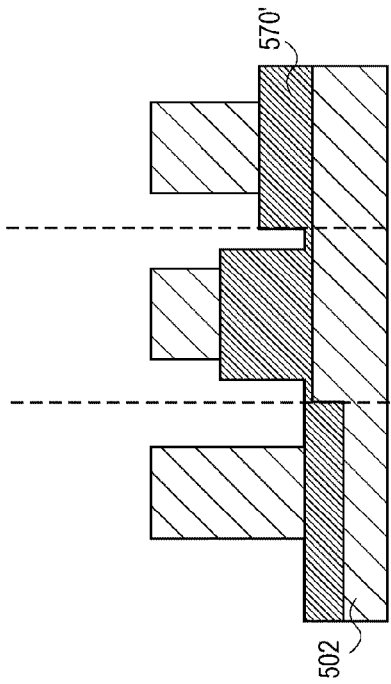

Referring to FIG. 5E, any remaining portions of the masking layers are removed and a first set of dielectric spacers 560 is formed along the sidewalls of fin 540, a second set of dielectric spacers 562 is formed along the sidewalls of fin 542, and a third set of dielectric spacers 564 is formed along the sidewalls of fin 544. It is to be understood that, in the case where the structures are directly adjacent, a sidewall spacer may form along the sidewalls of the exposed portions of layers 204, 206, 208 and 210. The exposed portions of substrate 502 are then oxidized to form an intervening dielectric layer 570, as depicted in FIG. 5F.

Figure 5G:
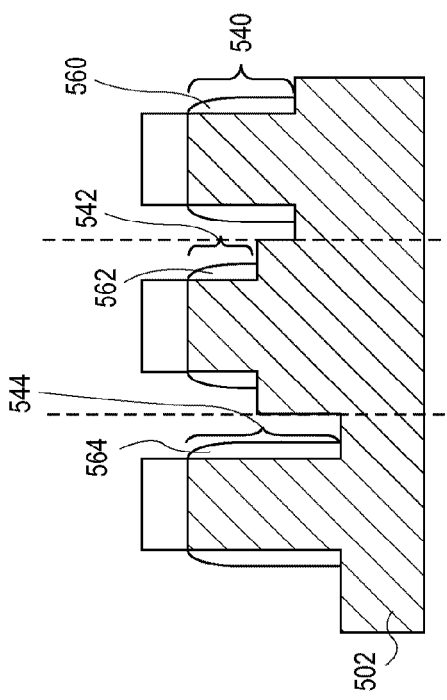
Figure 5H:
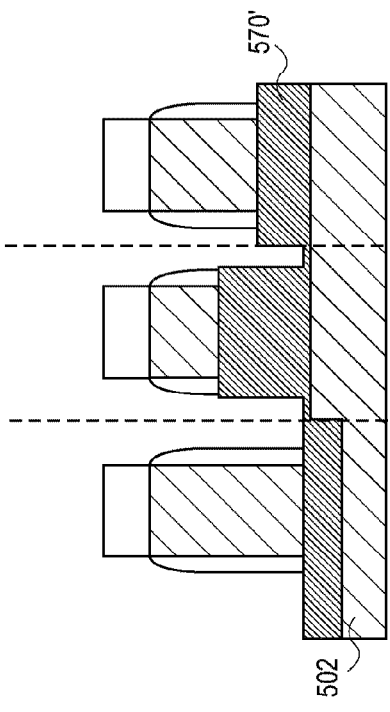

An oxide fill and recess with planarization may then be performed to provide modified intervening dielectric layer 570', as depicted in FIG. 5G. Then, referring to FIG. 5H, any remaining hardmask layers and sidewall spacers are removed to provide fins 540, 542 and 544 above modified intervening dielectric layer 570'.

Accordingly, more than two devices having differing semiconductor body heights, such as three different devices each with different semiconductor body heights, may be formed on a common substrate. For example, in an embodiment, the structure shown in FIG. 5H may be used to fabricate three different semiconductor devices. In one such embodiment, a semiconductor structure includes a first semiconductor device having a first semiconductor body disposed above a substrate. The first semiconductor body has a first height and an uppermost surface with a first horizontal plane. The semiconductor structure also includes a second semiconductor device having a second semiconductor body disposed above the substrate. The second semiconductor body has a second height and an uppermost surface with a second horizontal plane. The second height is less than the first height. The semiconductor structure also includes a third semiconductor device having a third semiconductor body disposed above the substrate. The third semiconductor body has a third height and an uppermost surface with a third horizontal plane. The third height is less than the second height. The first, second and third horizontal planes are co-planar.

In an embodiment, the semiconductor structure further includes an intervening dielectric layer disposed between the substrate and each of the first, second and third semiconductor bodies. In an embodiment, each of the first, second and third semiconductor bodies includes an isolated channel region. In an embodiment, each of the first, second and third semiconductor bodies includes a pair of isolated source and drain regions.

In an embodiment, the first semiconductor device further includes a first gate electrode stack at least partially surrounding a portion of the first semiconductor body. The second semiconductor device further includes a second gate electrode stack at least partially surrounding a portion of the second semiconductor body. The third semiconductor device further includes a third gate electrode stack at least partially surrounding a portion of the third semiconductor body. In one such embodiment, the first, second and third gate electrode stacks each has a high-K gate dielectric layer and a metal gate electrode layer.

In an embodiment, the first semiconductor device further includes first and second contacts at least partially surrounding respective portions of the first semiconductor body. The second semiconductor device further includes third and fourth contacts at least partially surrounding respective portions of the second semiconductor body. The third semiconductor device further includes fifth and sixth contacts at least partially surrounding respective portions of the third semiconductor body. In one such embodiment, the first semiconductor device further includes first and second spacers disposed between the first gate electrode stack and the first and second contacts, respectively. The second semiconductor device further includes third and fourth spacers disposed between the second gate electrode stack and the third and fourth contacts, respectively. Meanwhile, the third semiconductor device further includes fifth and sixth spacers disposed between the third gate electrode stack and the fifth and sixth contacts, respectively.

In an embodiment, each of the first, second and third semiconductor bodies are composed of silicon, and the first, second and third semiconductor devices are NMOS devices. In another embodiment, each of the first, second and third semiconductor bodies is composed of silicon germanium, and the first, second and third semiconductor devices are PMOS devices. In an embodiment, the third semiconductor device is disposed between the first and second semiconductor devices. In an embodiment, the first, second and third semiconductor devices are devices such as, but not limited to, tri-gate devices or fin-FET devices.

Accordingly, one or more embodiments described herein target active region height modulation through a bottom-up approach. That is, each device has a top active region surface in the same plane as the top active region surface of other devices, even though active region heights may vary. As such, the difference occurs in how proximate the bottom of the active region of each device is to an underlying common substrate. The bottom-up approach, as opposed to a top-down removal approach may prove to provide the best performance. For example, FEM circuits may exhibit an advantage in delay and power for bottom up approach (e.g., through delay increase relative to a full fin or power reduction relative to full fin. Embodiments described herein may enable improved performance on 14 nm node products and reduce standby leakage, e.g. for 14 nm node system-on-chip (SOC) products with extremely stringent standby power requirements. Embodiments described herein may allow better cell rebalancing and so reduction of Vccmin. The process flows described herein may be applicable to tri-gate and fin-FET type devices, or subsets thereof such as omega-gate, pi gate or fin with gate all around transistors.

Additionally, one or more embodiments of the present invention include use of an under fin oxide (UFO) process methodology to modulate the height of the active diffusion area. Under conventional processing of trigate or FIN-FET transistors from bulk silicon substrates, sub-FIN leakage of the resulting devices may occur. Such leakage may render difficult the targeting and controlling of $I_{off}$ (off-state source and drain leakage). The leakage may be effectively suppressed by the introduction of an insulating layer at the bottom of the fin, in the area that has poor or no gate control. Thus, in an embodiment, and as described above, the introduction of an insulating material also may enable an easy targeting of channel doping reduction to achieve a lightly doped or fully undoped channel device. Having a buried oxide in the sub-fin region may also relax the conflicting constraints and simultaneously enable a low-doped fin with high mobility, excellent device electrostatics and elimination of the substrate junction leakage. Also, the presence of an oxide under the source and drain regions may significantly reduce junction leakage.

One or more embodiments of the present invention provide a "cost-effective" solution to improving transistor performance and reducing stand-by power, e.g., for system-on-chip (SOC) ultra-low power devices which are limited by junction leakage in standby mode. Although such benefits may also be achieved by doping very highly the subfin region, such doping is difficult to perform without affecting the channel doping and, hence, impacting mobility. Alternatively, a prefabricated SOI substrate may be used but typically requires higher fabrication costs. Accordingly, one ore more embodiments involve the fabrication of, e.g., fin-FETs or trigate devices based on fins with a buried oxide layer. In one such embodiment, the buried oxide layer isolates the active fin channel from the underlying substrate. Such approaches may be cost-effective solutions since they may begin with bulk substrates and the isolating of the active fin from the substrate may be performed using localized oxidation in the subfin region.

Figure 6:
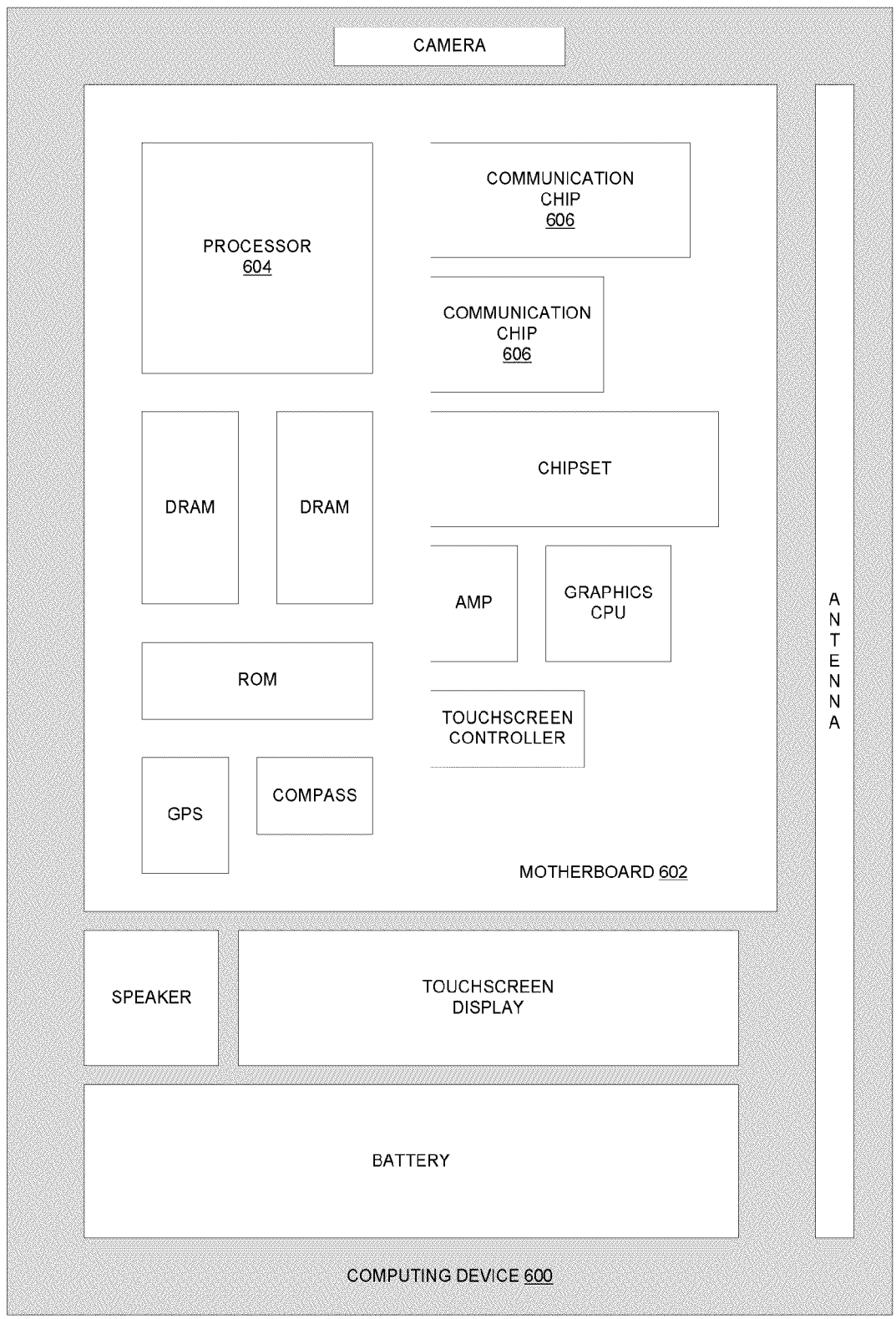
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, semiconductor devices having three-dimensional bodies with modulated heights and methods to form such devices have been disclosed. In an embodiment, a semiconductor structure includes a first semiconductor device having a first semiconductor body disposed above a substrate. The first semiconductor body has a first height and an uppermost surface with a first horizontal plane. The semiconductor structure also includes a second semiconductor device having a second semiconductor body disposed above the substrate. The second semiconductor body has a second height and an uppermost surface with a second horizontal plane. The first and second horizontal planes are co-planar and the first and second heights are different. In one embodiment, an intervening dielectric layer is disposed between the substrate and each of the first and second semiconductor bodies.

What is claimed is:

1. A method of fabricating a semiconductor structure, the method comprising:
   forming a first fin from a first region of a substrate, the first fin having a first height;
   forming a second fin from a second region of the substrate, the second fin having a second height different from the first height;
   forming sidewall spacers for the first and second fins;
   forming a dielectric layer below the first and second fins and below the sidewall spacers;
   subsequent to forming the dielectric layer, removing the sidewall spacers; and
   subsequent to removing the sidewall spacers, forming first and second semiconductor devices from the first and second fins, respectively.

2. The method of claim 1, wherein forming the first semiconductor device comprises forming a first isolated channel region, and forming the second semiconductor device comprises forming a second isolated channel region.

3. The method of claim 1, wherein forming the first semiconductor device comprises forming first isolated source and drain regions, and forming the second semiconductor device comprises forming second isolated source and drain regions.

4. The method of claim 1, wherein forming the dielectric layer comprises oxidizing a portion of the substrate.

5. The method of claim 1, further comprising:
   forming a third fin from a third region of the substrate, the third fin having a third height different from the first and second heights;
   forming a dielectric layer below the third fin; and
   forming a third semiconductor device from the third fin.

6. A semiconductor structure, comprising:
   a first semiconductor device comprising a first semiconductor body disposed above a substrate, the first semiconductor body having a first height and an uppermost surface with a first horizontal plane;
   a second semiconductor device comprising a second semiconductor body disposed above the substrate, the second semiconductor body having a second height and an uppermost surface with a second horizontal plane, wherein the first and second horizontal planes are co-planar and the first and second heights are different; and
   an intervening dielectric layer disposed between the substrate and each of the first and second semiconductor bodies, wherein a first portion of the intervening dielectric layer has an upper surface and a lower surface, a second portion of the intervening dielectric layer has an upper surface and a lower surface, and wherein the upper surface of the first portion of the intervening dielectric layer is co-planar with the upper surface of the second portion of the intervening dielectric layer but the lower surface of the first portion of the intervening dielectric layer is not co-planar with the lower surface of the second portion of the intervening dielectric layer.

7. The semiconductor structure of claim 1, wherein each of the first and second semiconductor bodies comprises an isolated channel region.

8. The semiconductor structure of claim 1, wherein each of the first and second semiconductor bodies comprises a pair of isolated source and drain regions.

9. The semiconductor structure of claim 1, wherein the first and second semiconductor devices are devices selected from the group consisting of tri-gate devices and fin-FET devices.

10. The semiconductor structure of claim 1, wherein the first semiconductor device further comprises a first gate electrode stack at least partially surrounding a portion of the first semiconductor body, and the second semiconductor device further comprises a second gate electrode stack at least partially surrounding a portion of the second semiconductor body.

11. The semiconductor structure of claim 10, wherein the first and second gate electrode stacks each comprise a high-K gate dielectric layer and a metal gate electrode layer.

12. The semiconductor structure of claim 10, wherein the first semiconductor device further comprises first and second contacts at least partially surrounding respective portions of the first semiconductor body, and the second semiconductor device further comprises third and fourth contacts at least partially surrounding respective portions of the second semiconductor body.

13. The semiconductor structure of claim 12, wherein the first semiconductor device further comprises first and second spacers disposed between the first gate electrode stack and the first and second contacts, respectively, and wherein the second semiconductor device further comprises third and fourth spacers disposed between the second gate electrode stack and the third and fourth contacts, respectively.

14. The semiconductor structure of claim 1, wherein each of the first and second semiconductor bodies consists essentially of silicon, and the first and second semiconductor devices are NMOS devices.

15. The semiconductor structure of claim 1, wherein each of the first and second semiconductor bodies consists essentially of silicon germanium, and the first and second semiconductor devices are PMOS devices.

16. A semiconductor structure, comprising:
a first semiconductor device comprising a first semiconductor body disposed above a substrate, the first semiconductor body having a first height and an uppermost surface with a first horizontal plane;
a second semiconductor device comprising a second semiconductor body disposed above the substrate, the second semiconductor body having a second height and an uppermost surface with a second horizontal plane, wherein the second height is less than the first height;
a third semiconductor device comprising a third semiconductor body disposed above the substrate, the third semiconductor body having a third height and an uppermost surface with a third horizontal plane, wherein the third height is less than the second height, and wherein the first, second and third horizontal planes are co-planar; and an intervening dielectric layer disposed between the substrate and each of the first, second and third semiconductor bodies, wherein a first portion of the intervening dielectric layer has an upper surface and a lower surface, a second portion of the intervening dielectric layer has an upper surface and a lower surface, and wherein the upper surface of the first portion of the intervening dielectric layer is co-planar with the upper surface of the second portion of the intervening dielectric layer but the lower surface of the first portion of the intervening dielectric layer is not co-planar with the lower surface of the second portion of the intervening dielectric layer.

17. The semiconductor structure of claim 16, wherein each of the first, second and third semiconductor bodies comprises an isolated channel region.

18. The semiconductor structure of claim 16, wherein each of the first, second and third semiconductor bodies comprises a pair of isolated source and drain regions.

19. The semiconductor structure of claim 16, wherein the first, second and third semiconductor devices are devices selected from the group consisting of tri-gate devices and fin-FET devices.

20. The semiconductor structure of claim 16, wherein the first semiconductor device further comprises a first gate electrode stack at least partially surrounding a portion of the first semiconductor body, the second semiconductor device further comprises a second gate electrode stack at least partially surrounding a portion of the second semiconductor body, and the third semiconductor device further comprises a third gate electrode stack at least partially surrounding a portion of the third semiconductor body.

21. The semiconductor structure of claim 20, wherein the first, second and third gate electrode stacks each comprise a high-K gate dielectric layer and a metal gate electrode layer.

22. The semiconductor structure of claim 20, wherein the first semiconductor device further comprises first and second contacts at least partially surrounding respective portions of the first semiconductor body, the second semiconductor device further comprises third and fourth contacts at least partially surrounding respective portions of the second semiconductor body, and the third semiconductor device further comprises fifth and sixth contacts at least partially surrounding respective portions of the third semiconductor body.

23. The semiconductor structure of claim 22, wherein the first semiconductor device further comprises first and second spacers disposed between the first gate electrode stack and the first and second contacts, respectively, wherein the second semiconductor device further comprises third and fourth spacers disposed between the second gate electrode stack and the third and fourth contacts, respectively, and wherein the third semiconductor device further comprises fifth and sixth spacers disposed between the third gate electrode stack and the fifth and sixth contacts, respectively.

24. The semiconductor structure of claim 16, wherein each of the first, second and third semiconductor bodies consists essentially of silicon, and the first, second and third semiconductor devices are NMOS devices.

25. The semiconductor structure of claim 16, wherein each of the first, second and third semiconductor bodies consists essentially of silicon germanium, and the first, second and third semiconductor devices are PMOS devices.

26. The semiconductor structure of claim 16, wherein the third semiconductor device is disposed between the first and second semiconductor devices.

* * * * *